United States Patent [19]

DeVita et al.

[11] 4,149,641

[45] Apr. 17, 1979

[54] COMPONENT FEED MECHANISM

[75] Inventors: Raymond A. DeVita, Hamilton; Daniel W. Woodman, Jr., Beverly, both of Mass.

[73] Assignee: USM Corporation, Farmington, Conn.

[21] Appl. No.: 789,830

[22] Filed: Apr. 22, 1977

[51] Int. Cl.² .............................................. B65G 59/06
[52] U.S. Cl. ...................................... 414/126; 29/809; 140/147; 221/243; 221/251; 227/2
[58] Field of Search ................ 29/564.1, 809; 221/125, 221/131, 240, 124, 210, 220, 221, 123, 236, 238, 243, 251, 112, 192; 140/147; 227/2; 214/8.5 A, 8.5 R, 8.5 K, 1 BB

[56] References Cited

U.S. PATENT DOCUMENTS

| 2,940,636 | 6/1960 | Pechy | 221/251 X |
|---|---|---|---|
| 3,297,201 | 1/1967 | Burt | 221/251 X |
| 3,550,238 | 12/1970 | Allen et al. | 29/206 |
| 3,727,284 | 4/1973 | Ragard et al. | 227/2 |
| 3,893,589 | 7/1975 | Mandell | 221/123 |
| 4,063,347 | 12/1977 | Woodman, Jr. | 140/147 X |

Primary Examiner—Frank E. Werner
Attorney, Agent, or Firm—Carl E. Johnson; Richard B. Megley; Vincent A. White

[57] ABSTRACT

An improved escapement is provided for use with a channel for feeding successive components to insure their continuous and individual release therefrom. The escapement includes elements for holding a next-to-endmost component in cooperation with a land extending lengthwise in the channel, in unobstructive position while the endmost component is released. The invention has particular advantages when one or more components in a stacked series may be of a form tending to overlap or have a small irregularity, such as a protruding flashing for instance, causing shingling and hence resisting automatic feeding one-by-one in the channel.

2 Claims, 8 Drawing Figures

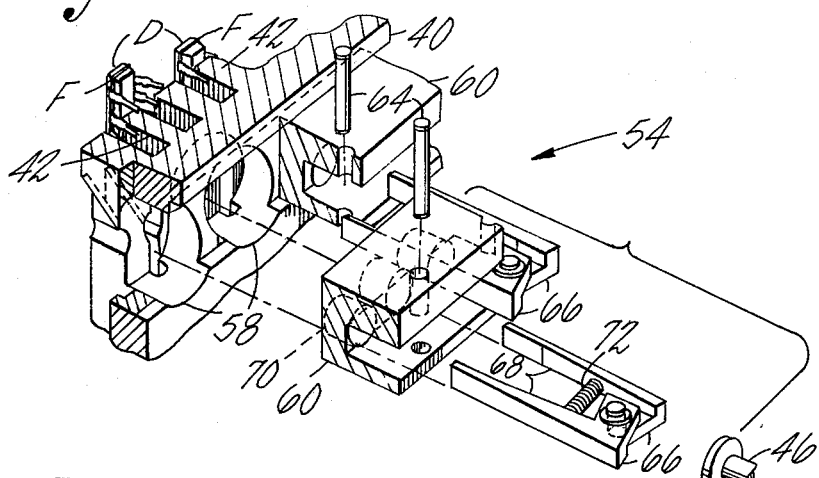
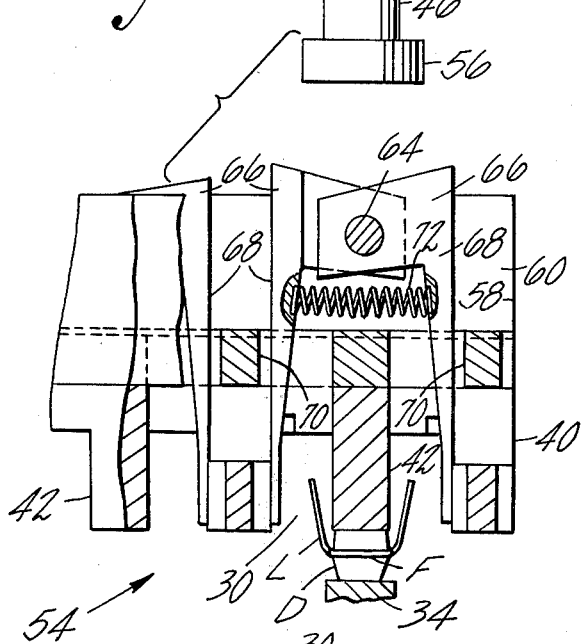
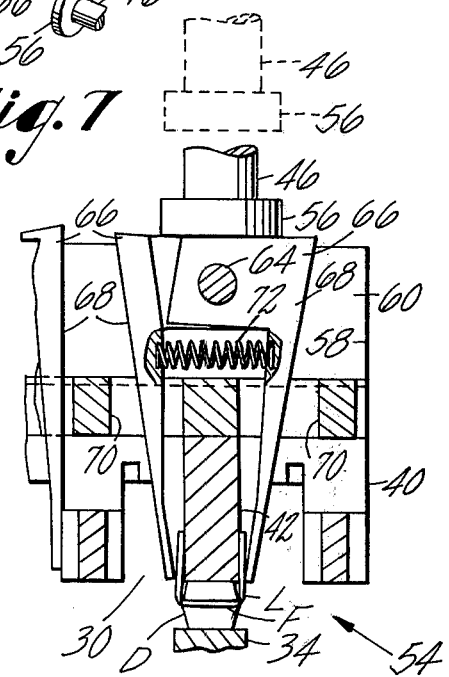
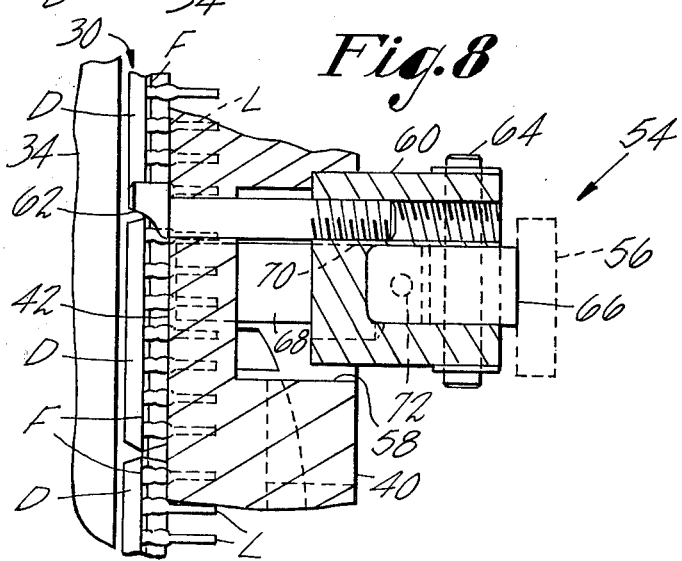

COMPONENT FEED MECHANISM

CROSS REFERENCE TO RELATED APPLICATION

U.S. Application Ser. No. 728,835 filed Oct. 1, 1976, in the name of Daniel W. Woodman (now U.S. Pat. No. 4,063,347) relates to a "Machine for Inserting Multi-Lead Components Sequentially", and includes features pertaining to raceway feeding of components.

BACKGROUND OF THE INVENTION

This invention relates to means for feeding components in succession.

A very large number of articles, particularly electronic components, are processed automatically for various purposes. Frequently, as in the disclosure of the above-cited application, they must be fed in succession and in uniform orientation to an operating locality wherein they may be inserted into a wiring board, simply tested, or otherwise dealt with. There is, of course, little point to providing highly automatic, expensive equipment for such purposes if the components to be processed are not delivered in proper predetermined position and at the reliable rate required.

It is a well known technique to employ, in conjunction with raceways or feeding channels, an escapement device essentially comprising a pair of actuatable plunger-like elements, one for detaining a next-to-endmost article in the raceway as the endmost article is released by the second element, and then shifting the second element into holding position in the raceway as the first element is retracted from its holding position. Such an arrangement may work well when the articles to be fed are invariably uniform and regular in configuration.

In the cited Woodman disclosure, in addition to providing an escapement of that general type, a side of a component delivering channel was made adjustable better to accommodate sliding and prevent overlap of adjacent components even though one or more happened to be non-uniform or have a protuberance. While that arrangement (and optional use of take-up leaf springs) works reasonably well, it is found that some adverse skewing and "hang-ups" may still occur due, for instance, to interaction between the next-to-endmost and the third-from-bottom articles. This arises seemingly by reason of a wedging of their abutting end formations, notably when the confronting faces of stacked components include a ridge such as results from flashings on molded bodies of the components. Usage of the conventional plunger type escapement means generally will not overcome the problem. Since large numbers of molded component bodies are processed, and elimination of flashing (as for example commonly encountered on DIP's entails a premium in the component unit price, a better solution to reliable feeding of such components is important to attain.

SUMMARY OF THE INVENTION

In view of the foregoing, it is an object of this invention to provide an improved escapement assuring automatic release of stacked components for feeding successively from a channel or the like.

More especially, it is an object of this invention to provide, in combination with a raceway for delivering successive electronic components such as DIP's, one or more of which may have body protuberances tending to interfere with feeding by gravity, an escapement avoiding pressures tending to clamp, skew or jam a body against an adjacent component body or against a side of the raceway, and thereby assuring reliable feeding.

BRIEF DESCRIPTION OF THE DRAWINGS

The foregoing and other features of the invention will now be described with more particularity in connection with an illustrative embodiment and with reference to the accompanying drawing thereof, in which:

FIG. 5 is an exploded perspective view of mechanism shown in FIG. 3;

FIG. 6 is a plan view of component gripping means shown in FIGS. 3 and 5, the grippers being in inactive positions;

FIG. 7 is a view corresponding to FIG. 6, the grippers now being in closed or lead-gripping positions; and FIG. 8 is a view similar to a portion of FIG. 3, the gripper means being viewed from its opposite side.

DESCRIPTION OF PREFERRED EMBODIMENT

It will be understood that, although the invention is illustrated and will be described as applied to the feeding of rectangular DIP-type components, the invention is not thus limited in use but is applicable to other types and shapes of components, not necessarily electronic.

Figure 4:
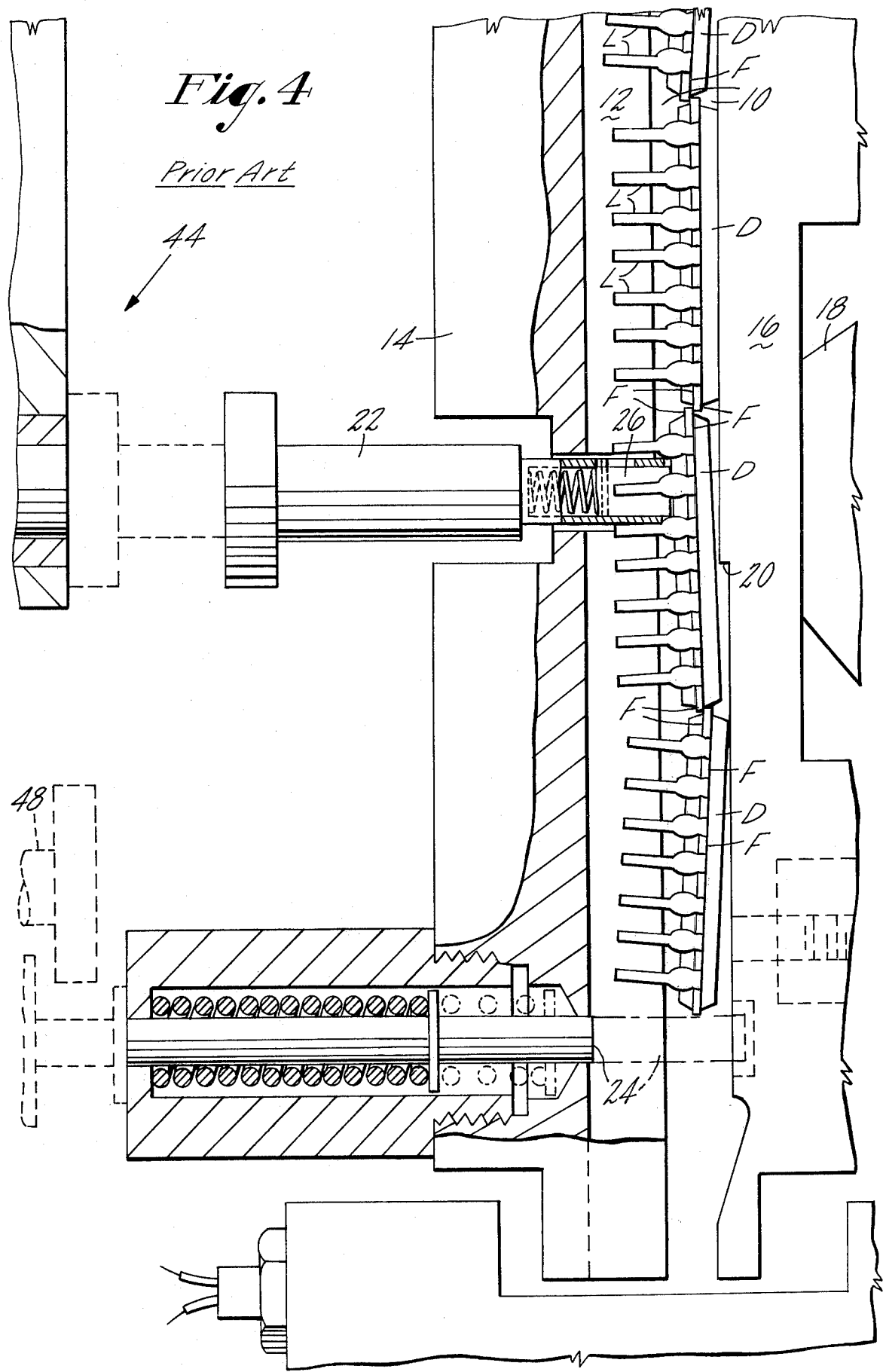
FIG. 4 is a view in side elevation of the prior art plunger-type escapement disclosed in the cited application, the parts being shown on a larger scale better to illustrate a component shingling or overlap condition avoided by the present invention.

Referring first to FIG. 4, for a better understanding of the problem solved by this invention, in the prior art a raceway generally designated 10 for feeding DIP's D in succession is partly defined by a guilding land 12 vertically extending between opposite rows of leads L projecting from the bodies of the components. It will be noted that midway of the thickness of each component body, which may be generally rectangular, there is a peripheral protrusion or flashing F. This protrusion in extending about the ends of the respective bodies is particularly conducive to interference with feeding. Adjacent ends in a feed channel may overlap or "shingle" as shown, as well as occasionally abut end to end, i.e. flashing F contacting an adjacent flashing F without overlap. As explained in the Application Ser. No. 728,835, in addition to providing a vertically slotted raceway or channel plate 14 for accommodating the rows of leads L, outer sides of the DIP bodies were intended to be slidably constrained against overlapping one another by the provision of an adjustable channel side 16, the selected position of the side 16 being determined by at least one rotatable cam 18 for the particular batch of components to be fed. Additionally, as indicated at 20 in FIG. 4, the guiding face of the side 16 was undercut to alleviate component hang-ups. These measures sometimes assisted proper feeding of the components as controlled by a pair of alternately operable plungers 22,24 but unfortunately the results were still not entirely satisfactorily, probably for reasons next to be explained.

The plungers 22,24 are so actuated and spaced heightwise that when the lower plunger 24 is serving as a stop for the bottom or endmost DIP about to be released from the channel 10, the upper plunger 22 is retracted therefrom to allow the second and subsequent DIP's successively to descend to the channel. Then, when the plunger 24 is retracted to its full line position, in FIG. 4, to allow the endmost DIP to freely descend by gravity the plunger 22 will have entered the channel 10 and engaged the second-from-bottom DIP to clamp it against a side of the magazine, in this case the side 16. (A spring-backed feeler or insert 26 (FIG. 4) in the plunger 22 may be employed to lessen impact on the component.) Note that the protruding end portions of the flashing F on the second DIP had come into overlapping relation to adacent end flashing on the first or endmost DIP and the third-from-endmost DIP. Consequently, the engagement of the plunger 22 with the second DIP cannot align it with the side 16. But, more importantly, the interacting flashing engagements at the ends of the DIP's are such that, even if the endmost component is released to descend, the second-from-endmost may be hung-up, and if the latter is not, the third-from-endmost may become hung-up. Aside from thus preventing continuous automatic component processing in the machine, the ram-like operation of the plunger 22 can damage the jammed component D and/or excessive time may be required by an attendant to dislodge and correct the component feeding.

Figure 1:
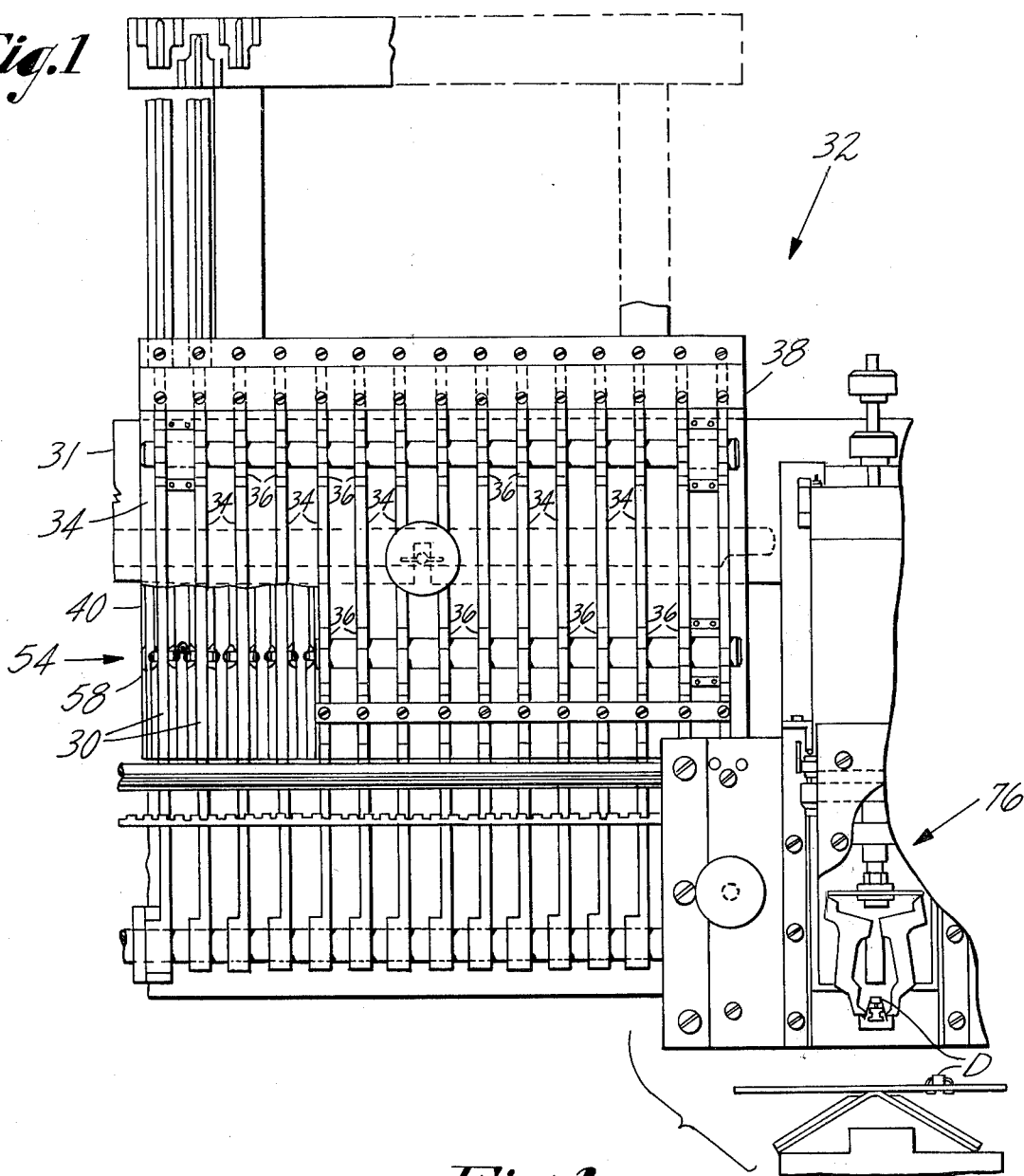
FIG. 1 is a view in front elevation of a portion of a machine for sequencing and inserting DIP-type components as disclosed in the mentioned Application Ser. No. 728,835, a portion being broken away to show escapements associated with channels, or raceways, respectively, as will hereinafter be described.
Figure 2:
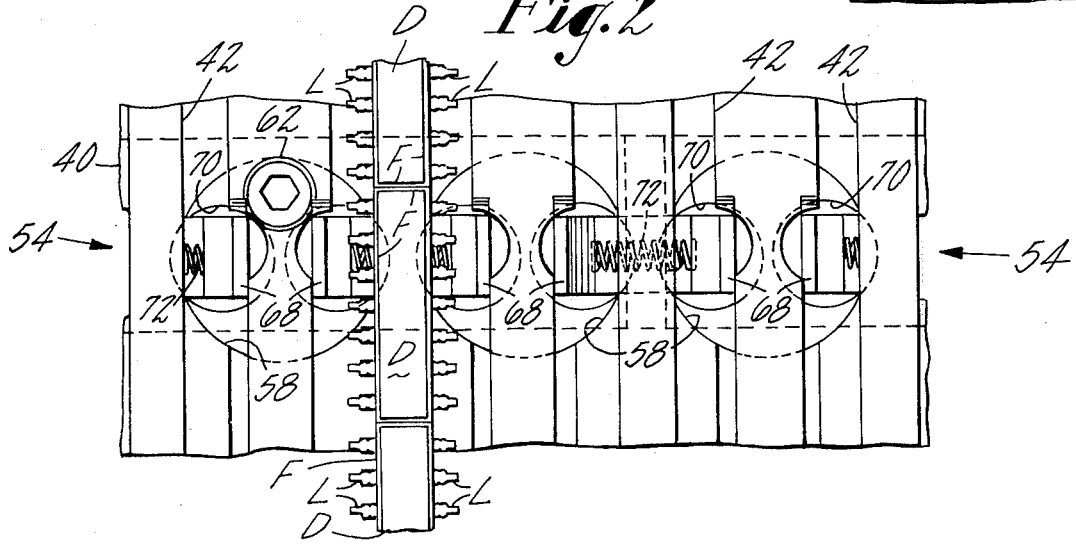
FIG. 2 is a view similar to a portion of FIG. 1 with parts broken away but showing on a larger scale, several of the raceways and escapements including open component grippers.
Figure 3:
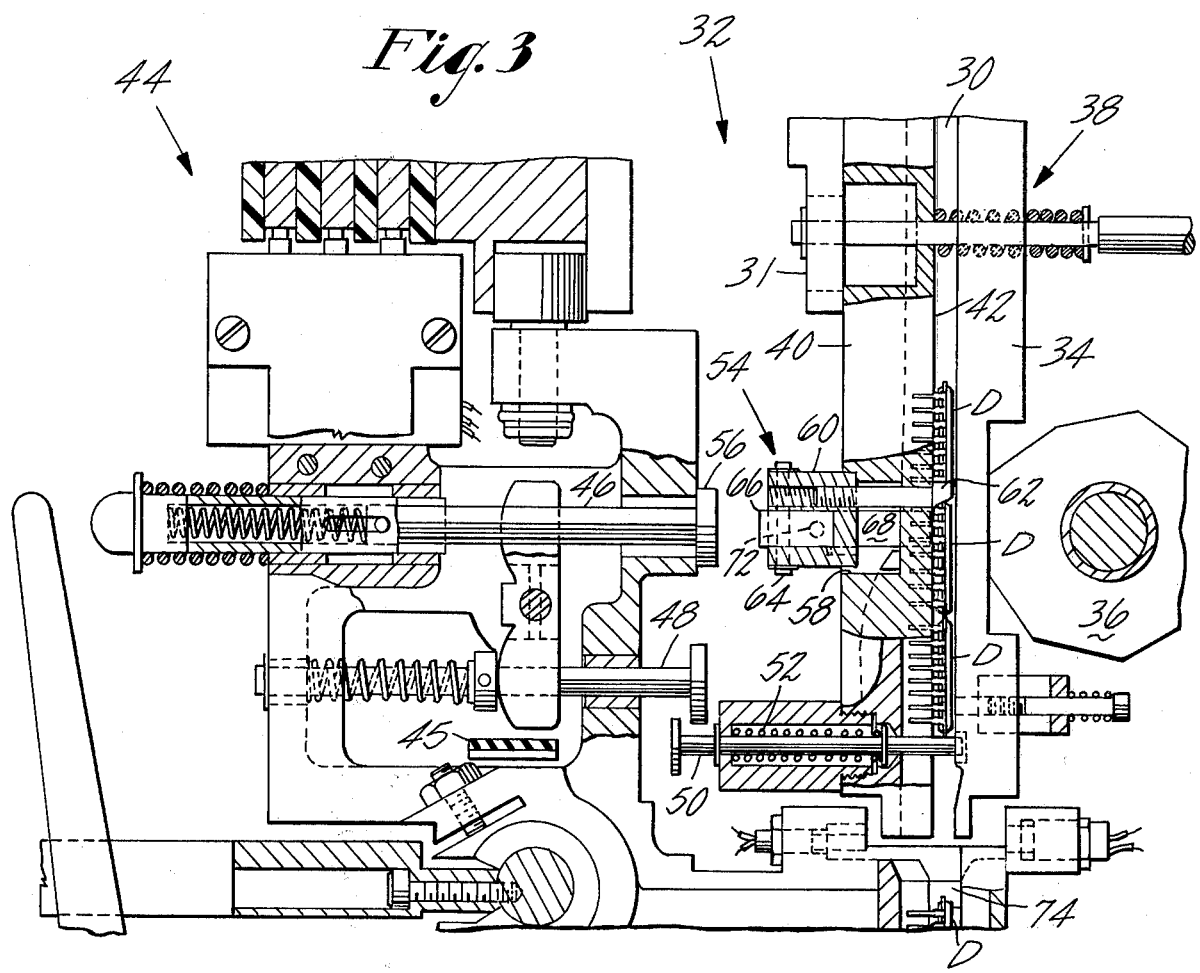
FIG. 3 is a view in side elevation with portions in section (corresponding largely to FIG. 6 of the cited application), showing a picker assembly about to cooperate with the novel escapement associated with one of the magazine channels.

Referring now more particularly to FIGS. 1–3, our improved escapement will be described in connection with raceways or channels 30 corresponding to the channels 10, mounted on a support 31, and as employed in a machine 32 for sequencing and inserting DIP's, the machine being assumed otherwise essentially similar to that disclosed in the above cited application. An adjustable series of channel side bars 34 (corresponding to the side 16) may be retained and each is suitably positioned as by a pair of hand-turnable cams 36 but it will be noted that no undercut such as that indicated at 20 in FIG. 4 is required. A stationary magazine 38 of the machine defining the channels 30 comprises a vertically slotted raceway plate 40, a land 42 (FIGS. 2, 3) intermediate adjacent slots being arranged to slidably engage inner sides of the DIP's D as they descend in their respective channels. Thus, a row of leads L is disposed on opposite sides of the lands.

A shuttle-like picker assembly 44 (FIG. 3) is movable laterally to selected positions as by a conveyor belt 45 (FIG. 3) in response to computer controlled means (not shown) for selecting and releasing pre-determined components such as D from the delivery ends of the respective channels 30 to be further processed according to a desired program. The assembly 44 comprises (as does the corresponding assembly 100 of the cited application) an upper plunger 46 and a lower plunger 48. The latter is unchanged in structure or function and serves to control retractive movement of a stop pin 50 arranged, when allowed forwardly under the influence of a spring 52, to project beneath the lowest component D as illustrated in FIG. 3. A series of the components are thus prevented from escaping from the raceway until the picker assembly actuates escapement means generally designated 54 (FIGS. 3, 5–8) as will be explained. It will be observed by way of contrast that though the upper plunger of the previously disclosed arrangement functioned as a component engaging detent of the escapement, in the present arrangement the upper plunger 46 of the picker assembly 44 serves as an actuator only of the novel escapement 54. Accordingly, in effect the plunger 46 has been shortened and has a forward end provided with an actuating head 56. Means for alternately reciprocating the plungers 46,48 fore and aft accordingly remain essentially unchanged.

Focusing now more particularly on the escapement 54 (FIGS. 3, 5–8) associated with each of the channels 30, the raceway plate 40 is bored to provide a circular hole 58 between adjacent lands 42 for accommodating the respective escapements 54 now to be described.

A support such as a U-shaped bar 60 is secured to the plate 40 by bolts 62. A vertical pivot pin 64 mounted in the bar extends through bores in the respective short arms of a pair of grippers 66,66 so that a longer arm 68 of each may project forwardly through a clearance hole 70 in the bar for engagement with the outer sides of a plurality of the leads L of a component D. A spring 72 is disposed to engage the arms 68 of each cooperating pair to bias them to a normally open position as shown in FIG. 6. However, when the shorter angularly related arms of the open grippers are engaged by the head 56 as shown in FIG. 7 to pivot them about the pin 64, the arms 68 yieldingly close and laterally engage the leads L to urge them against opposite sides of the land 42, thus insuring that they and their component body and its flashing F cannot interfere with an adjacent component D. This is to say that closure of the grippers imposes no interference by a further deflection or tilting of the component thus held and it, even though it be in overlapping relation to an adjacent component end portion, above or below, will not impede their advance toward the delivery end when the head 56 is subsequently retracted to allow gripper reopening.

Briefly to review operation of the machine 32 with particular reference to the escapement 54, when the picker assembly 44 arrives at a selected raceway or channel 30 to receive its endmost component D for delivery to an inserting head 76 (FIG. 1), the head 56 is moved forwardly to actuate the grippers 66,66 to closed or holding position relative to the next-to-bottom most component in that raceway. Simultaneously, the lower plunger or stop 50 is retracted from the raceway 30 so that the endmost, i.e. bottom component D is thereby released for transfer by gravity to a carrying pocket 74 (FIG. 3) of the picker assembly 44. Release of the endmost component is now assured since it cannot now incur interference from the next-to-endmost component or its flashing F. This is so for the reason that closure of the grippers 66,66 laterally does not deflect the next-to-endmost component to bias it against a wall of the raceway or against the adjacent upper or lower component D. Hence, even though the component bodies (by reason of flashing protrusion or otherwise) are of a configuration tending to overlap or shingle, the component D as held by the laterally acting grippers 66 transmits no pressure to clamp the held component against adjacent components or against a wall of the raceway. Holding forces of the oppositely acting grippers 66 are applied yieldingly transversely of the raceway and only against the component but do not deflect or bias it against an adjacent component or a wall of the raceway. Thus the held component is not displaced from its path of flow as was the case with the single plunger of prior art.

From the foregoing, it will be clear that, although a few more escapement parts are required to be provided for each raceway or channel 30, they are simple in design and, more importantly, they serve to assure continued delivery of the required components D without hiatus in operation of the machine 32. The escapements 54 have no adverse affect, of course, should the components D have no interfering flashing F or the like.

Having thus described our invention, what we claim as new and desire to secure by Letters Patent of the United States is:

1. In a machine for sequencing and inserting components provided with bodies and generally parallel, oppositely spaced leads projecting therefrom, said machine having an inserting head, a plurality of raceways arranged in a series for slidably supplying said components in selected succession from the respective raceways, each of the raceways including a land having lead engageable sides parallel to internal adjacent walls of the raceways and a component body engageable side, and a picker assembly movable between successively selected raceways and the head to deliver components one at a time from a delivery end of a selected raceway to the head, an escapement mechanism associated with at least the selected raceway and comprising flat leaf spring means having portions closeable yieldably toward the lead engageable side of said land to cooperatively orient and hold a component in temporary fixed position by forces applied to the component from opposite directions and transversely of the raceway, and means mounted on the picker assembly for actuating the closeable leaf spring means.

2. The combination with a vertically disposed raceway for feeding dual in-line electronic components arranged in tandem, each of the components including a body having an inner side and a plurality of leads projecting from opposite sides of the body, the raceway having a land formed with vertical parallel sides for slidably engaging the leads and inner sides of the component bodies and an adjustable wall slidably engageable with outer sides of the bodies to constrain them in their path toward a delivery end, of escapement mechanism comprising stop means movable into and out of said path to retain and release the endmost component in the raceway, movable means closeable widthwise of the raceway and said wall and arranged above the stop means for yieldably engaging opposite leads of the next-to-endmost component in the raceway path to urge them simultaneously into clamping and parallel relation with opposite sides, respectively, of the land thus to true the next-to-endmost component into a subsequently releasable condition upon opening of said means without causing tilting of the next-to-endmost component into interference relation with said adjustable wall or adjacent components in the raceway, and means for alternately actuating the stop means and said movable means.

* * * * *